US011360923B2

(12) United States Patent
Ayyanagouda et al.

(10) Patent No.: US 11,360,923 B2
(45) Date of Patent: Jun. 14, 2022

(54) MULTI-FUNCTION SD CARD

(71) Applicant: Western Digital Technologies, Inc., San Jose, CA (US)

(72) Inventors: Loka Ayyanagouda, Bangalore (IN); Nagarajan Ragupathy, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 142 days.

(21) Appl. No.: 16/904,808

(22) Filed: Jun. 18, 2020

(65) Prior Publication Data
US 2021/0397576 A1 Dec. 23, 2021

(51) Int. Cl.
G06F 13/40 (2006.01)
H05K 1/18 (2006.01)
H05K 7/14 (2006.01)

(52) U.S. Cl.
CPC ........... G06F 13/4068 (2013.01); H05K 1/18 (2013.01); H05K 7/1427 (2013.01); H05K 2201/10159 (2013.01)

(58) Field of Classification Search
None
See application file for complete search history.

(56) References Cited

U.S. PATENT DOCUMENTS

| | | | | |
|---|---|---|---|---|
| 7,193,161 B1 * | 3/2007 | Takiar | ..................... | H01L 24/97 174/521 |
| 8,102,062 B1 * | 1/2012 | Lassa | .................. | H01L 25/0657 257/786 |
| 2013/0262764 A1 * | 10/2013 | Jow | .................. | G06K 19/07732 711/115 |
| 2014/0104935 A1 * | 4/2014 | Ware | ..................... | G11C 7/1087 365/154 |
| 2015/0271911 A1 * | 9/2015 | Chen | ........................ | H05K 1/18 29/841 |
| 2016/0062798 A1 * | 3/2016 | Lee | ........................ | G06F 9/5027 718/104 |
| 2016/0087630 A1 * | 3/2016 | Park | ................... | H03K 19/0005 326/30 |
| 2018/0061578 A1 * | 3/2018 | Ning | .................... | H01G 4/1209 |
| 2019/0158096 A1 * | 5/2019 | Tang | ................... | H01L 23/5381 |
| 2020/0042853 A1 * | 2/2020 | Seo | ..................... | H04M 17/023 |
| 2021/0080638 A1 * | 3/2021 | Nichol | ................... | G02B 6/006 |

* cited by examiner

Primary Examiner — Henry Tsai
Assistant Examiner — Christopher A Bartels
(74) Attorney, Agent, or Firm — Dickinson Wright PLLC; Steven C. Hurles

(57) ABSTRACT

A multi-memory SD card includes an enclosure having the outer dimensions of a standard SD card. Two separate SiP SD packages are provided along with two separate sets of electrical contacts each according to the SD standard to provide, in a single SD card bundle, the functions and performance of two SD cards. The SiP packages may both be full size SD format, or one may be a micro- or nano- SD card. The first and second SiP SD packages has the same or different capacity and/or speed, and the micro- or nano- SiP package is permanent or removable. An onboard battery and/or PCB may also be housed in the enclosure for configuring WiFi/redundant array of independent disks (RAID) or backup.

17 Claims, 3 Drawing Sheets

MULTI-FUNCTION SD CARD

BACKGROUND OF THE INVENTION

1. Technical Field

This invention relates generally to removable non-volatile memory cards, particularly SD cards.

2. Related Art

Standard SD (secure digital) type cards are a non-volatile memory card format for use in numerous consumer and industrial portable devices for removable flash memory applications. The SD Association sets forth the up-to-date SD standards for the industry and makes those standards publicly available. Those standards define a variety of memory card storage capacity and speed formats that are tailored to the needs of a variety of different applications and include secure digital standard capacity (SDSC), secure digital high capacity (SDHC), secure digital extended capacity (SDXC), and secure digital ultra capacity (SDUC). The package size of SD cards are also standardized. The outside dimension of a full size SD card (in mm) is 32×24×2.1. There are also micro-sized versions of SD cards with standard dimensions (in mm) of 15×11×1.0, as well as a nano-sized SD cards.

Standard SD cards include a SD memory that is housed within a flat, thin rectangular enclosure (of the standard sizes noted above). FIG. 1 illustrates a conventional SD card 10 having a SD memory 12 disposed within a cavity 14 of an enclosure 16. The SD memory 12 occupies less that the entire space or cavity 14 within the standard enclosure 16. In FIG. 1 it will be seen that the SD memory 12 occupies less than the upper half of the SD card enclosure cavity, with the lower half taken up by plastic structure of the enclosure. The SD memory 12 communicates outside of the enclosure 16 through a set of electrical external contacts 18 disposed on a board 20 on which the SD memory 12 is mounted. The contacts 18 are operative when connected to a corresponding set of contacts of a selected electronic device for transferring data to and from the SD memory 12 and the device.

Current SD cards, regardless of size, platform or capacity, have a single standardized SD memory that communicates outside of the device through a single set of standardized SD external contacts. A card that has high capacity but slow speed may not be suitable for an application (such as video) calling for high speed. On the other hand, a card that has high speed may not have suitable capacity for some storage needs. Thus, users needing both performance metrics (speed and capacity) may be left having to purchase and carry two separate SD cards. A limitation also exists when a user needs both a full size SD card and a micro- or nano-SD card, wherein two separate cards are required.

SUMMARY

An electronic circuit card includes a generally flat, card-shaped enclosure in which a first set of electronic SD memory circuits are housed having a protocol following an SD card standard. A first set of electrical contacts are disposed externally of the enclosure at a first location thereof having a contact pattern following an SD card standard. A second set of electronic SD memory circuits are provided that are separate from the first set of electronic SD memory circuits. There are also a second set of electrical contacts distinct from the first set of electrical contacts and disposed externally of the enclosure at a second location thereof.

According to an embodiment, the card provides a dual SD card capability in a single package. Such a dual card has two SD memory circuit cards housed in two different regions of the enclosure and each communicates with an associated set of external electrical contacts. Such a card provides, in effect, two SD cards in the confines of a single enclosure according to the SD standard.

According to further aspect, such a dual SD card may have SD memory cards of the same or different capacity and/or speed (for example, a 256 GB memory card and a 128 GB memory of the same speed; or a 256 GB multi-level cell (MLC) memory at 12.5 MB/s and a 32 GB high speed single-level cell (SLC) memory at 25 GB/s).

According to a further embodiment, the SD card of full size format may include a first SD memory card of the full size format housed in a portion of the enclosure and having a first set of external electrical contacts according to the full size SD format, and may further include an SD memory card of the micro- or nano-format with a second set of associated contacts of the micro- or nano-SD standard.

According to a further aspect, the micro- or nano-memory card may be removable from the enclosure.

According to a further aspect, there may be a switch that, in a first position, is operative to couple the first set of electrical contacts to the first SD memory card and, in a second position, is operative to couple the first set of electrical contacts to the second micro- or nano-SD memory card.

According to a further aspect, the SD card having the full size SD memory card and micro- or nano-memory card may further include a battery housed within the enclosure in an area unoccupied by the two memory cards.

According to a further aspect, the SD card having the full size SD memory card, micro- or nano-memory card and optionally a battery may further include a printed circuit board (PCB) housed within the enclosure in an area unoccupied by the two memory cards and optionally the battery.

BRIEF DESCRIPTION OF THE DRAWINGS

These and other aspects and features of the invention will be better understood when considered in connection with the detailed drawings and description, in which.

DETAILED DESCRIPTION OF EMBODIMENTS OF THE INVENTION

Figure 2:
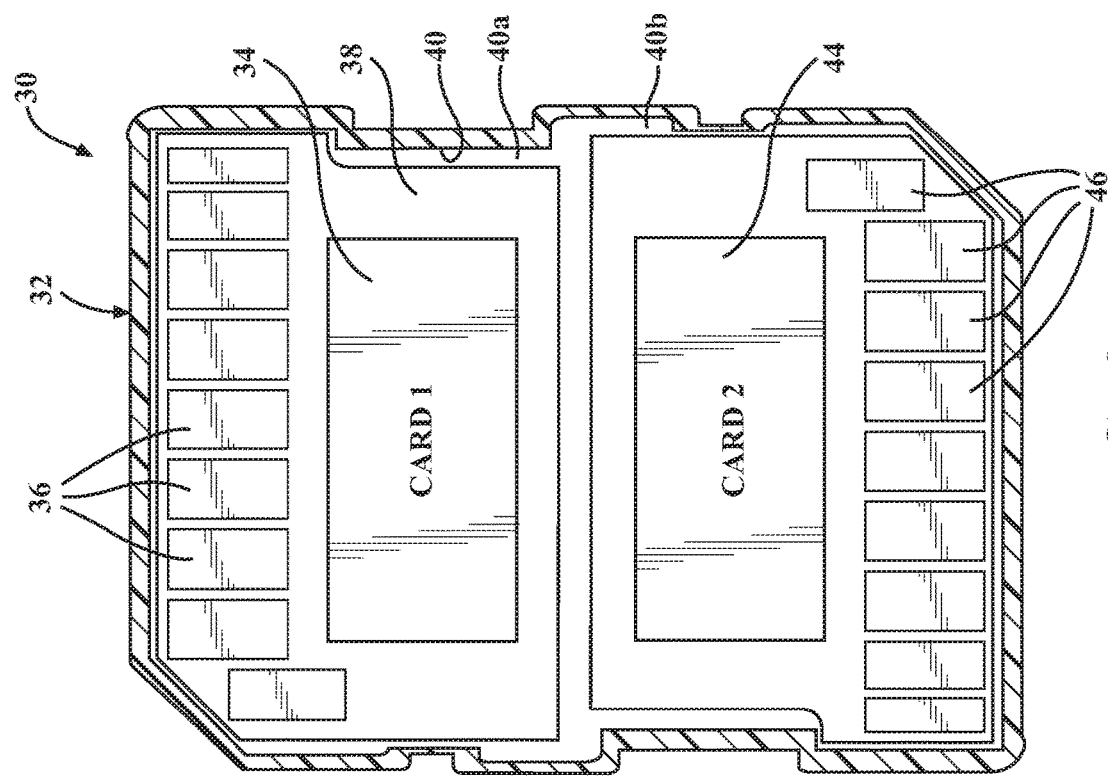
FIG. 2 is a plan view of a dual SD card according to an embodiment.
Figure 1:
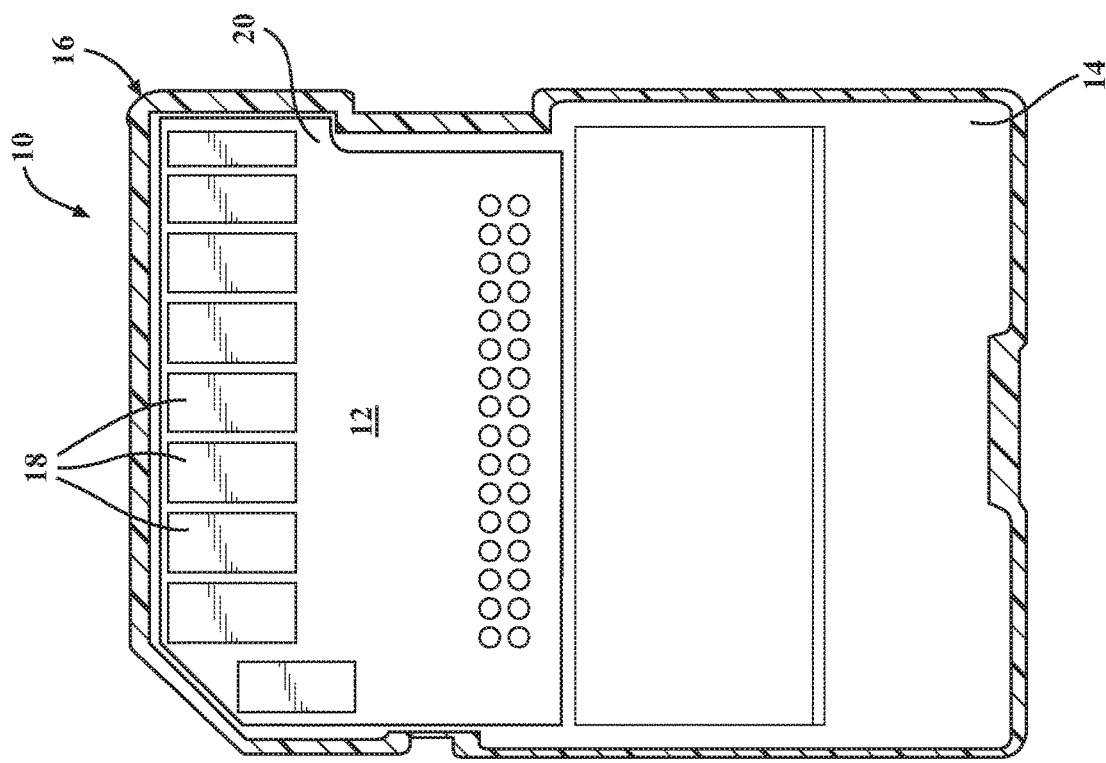
FIG. 1 is a plan view of a prior art full size SD card, with portions broken away.

An electronic circuit card according to a first embodiment of the invention is generally illustrated at 30 in FIG. 2 and includes a card housing, case or enclosure 32 that conforms in outer dimensions to the standards of the SD Association. The standard dimensions, in mm, for a full size SD card is 32×24×2.1. The standard for a micro-SD card is 15×11×1.0. In the embodiment shown, the enclosure 32 follows the full size SD card standard and thus its outer dimensions and overall functionality in regard to mating with SD card-receiving portable consumer and commercial devices is followed.

The card 30 includes a first set of electronic SD memory circuits 34. This may also be called a first SiP package, first SiP SD card, or simply card 1, and will be understood by these terms to mean and encompass the construction and functional components required to enable an SD card to store and retrieve data according to the SD format between the card and an external device in which the card is to be installed.

The SD card 30 further includes a first set of electrical contacts 36. These are according to the SD standard and thus have a predetermined pattern and placement relative to the enclosure 32 that enable the first SiP SD card 34 to communicate outside the enclosure with the selected device (such as a computer or a digital camera or the like) and exchange data therebetween. The contacts 36 are contained on a board 38 on which the SiP SD memory card 34 is mounted. The SiP SD card 34 and part of the board 38 are housed within the enclosure 32 and occupy generally the upper half of the space within the enclosure as illustrated in FIG. 2. It will be understood that the contacts 36 are exposed externally of the enclosure 32 for engaging corresponding contacts (not shown) of the device in which the SD card 30 is to be installed.

The enclosure 32 has an interior space or cavity 40 in which the first SiP package 34 is disposed. The cavity 40 of the enclosure 32 has dimensions (in mm) of 30×21.75. The dimension of the first SiP package 34 (including the board 38) has dimensions less than that of the cavity 40. More particularly, the dimensions of the first SiP package 34 (in mm) are 10.1×21.35. The first SiP package 34 thus occupies less than all of the cavity 40, and may be arranged so as to occupy 50% or less of the available space in the cavity 40. As illustrated in FIG. 2, the first SiP package may occupy the top half 40a, or less of the cavity 40, with the remaining lower half 40b unoccupied by the first SiP package 34.

The card 30 includes a second set of electronic SD memory circuits 44 that are separate from the first set of electronic SD memory circuits 34, and a second set of electrical contacts 46 that are distinct from the first set of electrical contacts 36. The same nomenclature is understood to apply as used in connection with the first SiP package 36. According to the embodiment of FIG. 2, the second set of electronic memory SD circuits is another SiP package according to the SD standard. It can be identical to the first SiP package or may be a different SiP package from the family of SD standard SiP packages. Included is a second board 38 on which the second contacts 36 and second memory 34 are mounted. The second SiP package (like the first) may be housed in the enclosure 32, but in the available remaining space not occupied by the first SiP package 34. As illustrated in FIG. 2, the second SiP package 44 preferably occupies the lower half 40b, or less, of the cavity 40, and as such sits opposite the first SiP package 34. The second set of contacts 46 are external to the enclosure 32 and are disposed at the opposite end of the enclosure 32 of the first set of contacts 36. The contacts 46 have rotational symmetry with the contacts 36. One would use the card 30 by connecting the first or second set of contacts with a selected device to access either the first or second SiP package. The card could be flipped around and reinstalled to access the other SiP package.

The second SiP package 46 may be the same or different than that of the first SiP package, meaning that the first and second SD memory cards 36, 46 may have the same or different storage capacity and/or speed. For example the first SiP package 36 may be a 256 GB SDSC, which has a standard speed of 12.5 GB/s, and the second SiP package 46 may likewise be a 256 GB SDSC memory of the same speed. Such an SD card thus would have double the capacity in a single package size.

Another embodiment of the dual memory SD card 30 includes the first SiP package 36 as a higher capacity/slower speed memory card, in combination with the second SiP package 46 taking the form of a higher speed/lower capacity memory card. For example card 1 may be the 256 GB card described above, in combination with a 32 GB HS SLC card having a speed of 25 GB/s. This combination would give a consumer the ability to store data such as documents on card 1, while using the higher speed card 2 for photos or video—all within a single card package format. Such a card would not only be dual storage, but dual usage in a single SD card bundle.

Figure 4A:
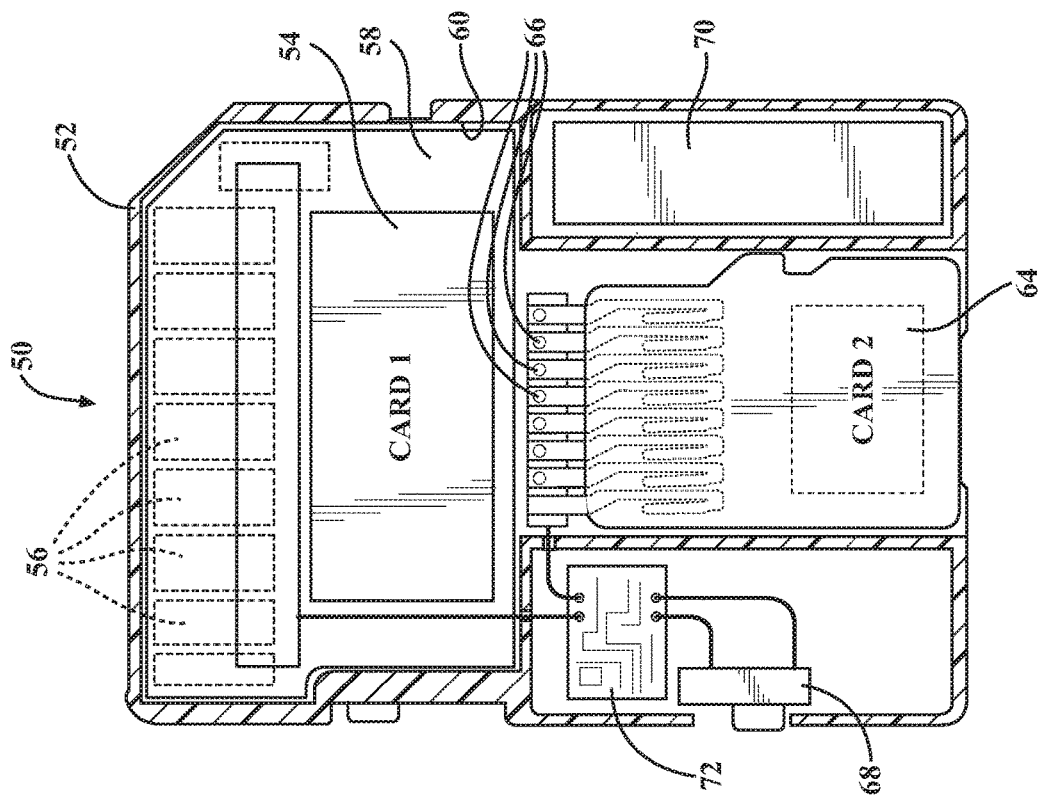
FIG. 4A is a plan view of the card of FIG. 3 with the micro- or nano-card installed.
Figure 3:
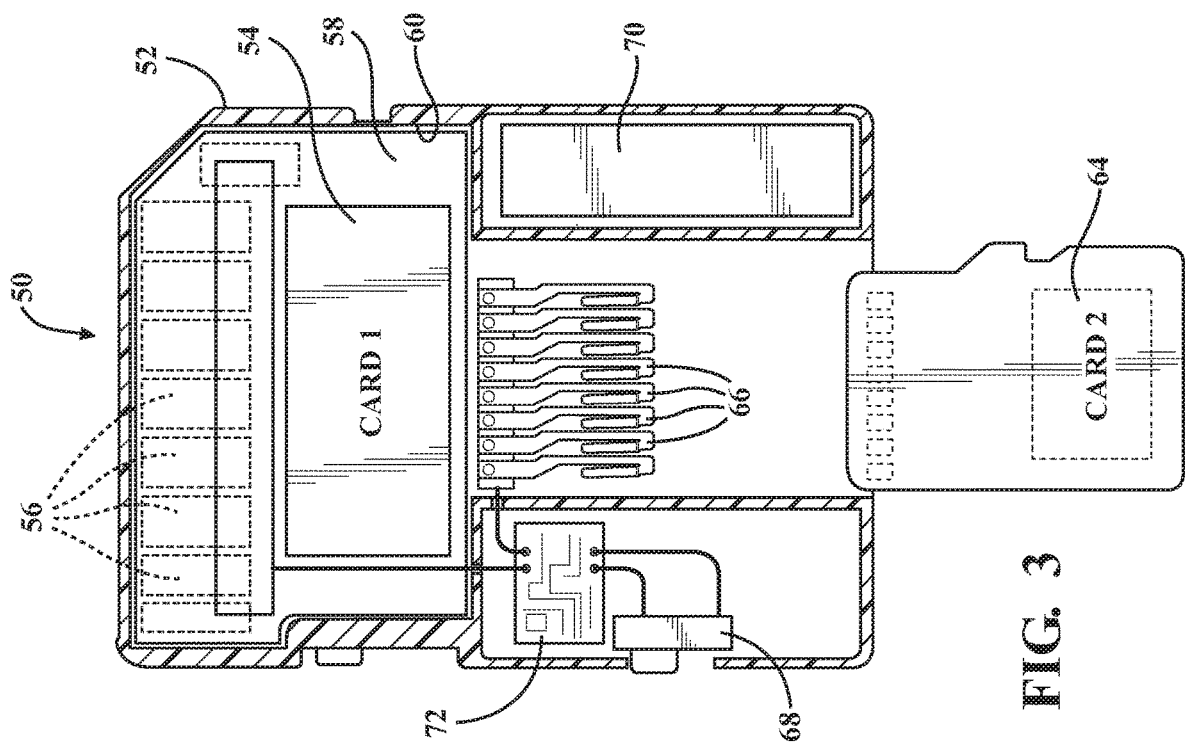
FIG. 3 is plan view of a dual SD card according to another embodiment.
Figure 4B:
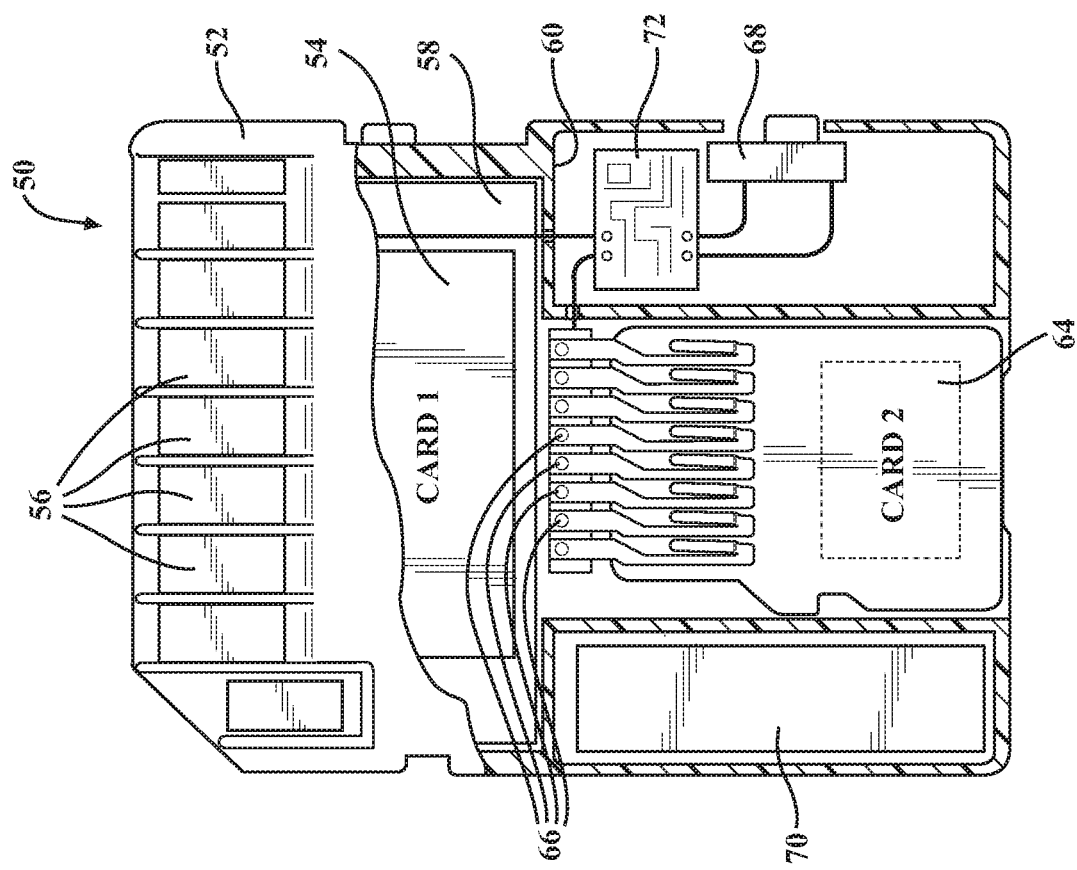
FIG. 4B is a bottom view of the dual card of FIG. 4A.

Those skilled in a the art will recognize that other combinations are possible, with the objective being to provide in a single SD card package effectively two SD cards which still conforms in size, shape, functionality and operation to the SD standard, but offers two functional cards in the package size of a single SD card, and the SD memories can be the same or different capacity and speed to meet a user's needs. SDSC, SDHC, SDXC and SDUC platforms are contemplated as formats for card 1 and/or card 2 in all combinations. Other options for card 1 and/or card 2 include SLC, MLC, TLC and QLC SD cards FIGS. 3 and 4A and 4B illustrate a further embodiment of a multi-function SD card, wherein similar terms and understandings are adopted as used in the preceding embodiments. The card 50 has an enclosure 52 sized according to the full size SD standard and includes a first set of electronic memory circuits according to the SD standard that may be the same as that employed for the first SiP package 36 of the prior embodiments, and may further include the same first electrical contacts 56 contained on a board 58 together with the memory card 54. The first SiP package may likewise occupy half or less of the cavity 60 of the enclosure 52, and may occupy the upper half as illustrated, with the contacts 56 externally disposed.

The second SiP package 64 differs in this embodiment from the second SiP package 44 of the prior embodiments in that it may have either a micro- or nano-SD card format. Micro-SD SiP cards have a dimension (in mm) of 15×11×1.0. The available space in the cavity unoccupied by the first SiP package 54 is 21.35×13.98, which is more than sufficient than to accommodate the second SiP package micro- or nano-SD card 64.

The card 50 has a second set of electrical contacts 66 that connect with the second SiP package and are according to the SD standard on size and pattern (i.e., micro- or nano-SD format). The second SiP package 64 may be permanently attached and housed non-removably within the enclosure 52, or the second SiP package may be selectively removable, as illustrated in FIGS. 3 and 4A and 4B. Based on its size, the second SiP occupies less than all of the lower half of the cavity 60.

The card 50 includes a switch 68 with leads that electrically and selectively couple the second electrical contacts 66 with the first electrical contacts 56. In a first position, the switch operates to couple the first electrical contacts 56 with the first SiP package 54 for transferring data to and from the first SiP package 54 externally to a selected device. In a second position, the first and second electrical contacts are coupled and data is transferred to and from the second SiP externally through the first set of electrical contacts.

The cavity space 60 not occupied by the first and second SiP packages 54, 64 may house additional features, such as a battery 70 and or a PCB 72 with a wireless module for communicating with the external device wirelessly, such as through WiFi® or Bluetooth® protocols and/or may include a backup memory module.

Obviously, many modifications and variations of the present invention are possible in light of the above teachings. It is, therefore, to be understood that the invention may be practiced otherwise than as specifically described while still being within the scope of the invention.

What is claimed is:

1. An electronic circuit card, comprising:
    a flat 32 mm×24 mm×2.1 mm or 15 mm×11 mm×1 mm card-shaped enclosure;
    a first set of electronic Secure Digital (SD) memory circuits housed within the enclosure, and including a first set of electrical contacts disposed externally of the enclosure at a first location thereof having a contact pattern;
    a second set of electronic SD memory circuits that are separate from the first set of electronic SD memory circuits, and including a second set of electrical contacts distinct from the first set of electrical contacts and disposed externally of the enclosure at a second location thereof; and
    wherein the first set of electrical contacts are located at a first end of the enclosure and the second set of electrical contacts are located at an opposite end of the enclosure.

2. The card of claim 1, wherein the first and second set of electronic SD memory circuits have the same capacity and/or speed.

3. The card of claim 2, wherein the first and second set of electronic SD memory circuits have different capacities and/or speeds.

4. The card of claim 1, wherein the enclosure has dimensions of 32 mm×24 mm×2.1 mm.

5. An electronic circuit card, comprising:
    a 32 mm×24 mm×2.1 mm or 15 mm×11 mm×1.9 mm card-shaped enclosure;
    a first set of electronic Secure Digital (SD) memory circuits housed within the enclosure, and including a first set of electrical contacts disposed externally of the enclosure at a first location thereof having a contact pattern;
    a second set of electronic SD memory circuits that are separate from the first set of electronic SD memory circuits, and including a second set of electrical contacts distinct from the first set of electrical contacts and disposed externally of the enclosure at a second location thereof; and
    a switch that is operative in a first position to couple the first set of electrical contacts to the first set of electronic SD memory circuits and operative in a second position to couple the first set of electrical contacts to the second set of SD memory circuits.

6. The card of claim 5 including a battery housed within the enclosure.

7. The card of claim 6 including a printed circuit board (PCB) housed within the enclosure.

8. An Secure Digital (SD) card, comprising:
    an enclosure having dimensions of 32 mm×24 mm×2.1 mm or 15 mm×11 mm×1.0 mm;
    a first SiP package disposed within the enclosure;
    a second SiP package carried by the enclosure at a location separate from the first SiP package;
    electrical contacts on an outer surface of the enclosure operative to transfer data between the SiP packages and outside of the card through the electrical contacts; and
    wherein the electrical contacts include a first set of electrical contacts at a first end of the enclosure communicating with the first SiP package and a second set of electrical contacts at an opposite end of the enclosure communicating with the second SiP package.

9. The SD card of claim 8, wherein the first SiP package has a first memory capacity and speed and the second SiP package has a second memory capacity that is the same or different than that of the first memory capacity and a second speed that is the same or different than that of the first speed.

10. The SD card of claim 9, wherein the first SiP package has a predetermined storage capacity and speed and the second SiP package has a lower storage capacity and a higher speed that that of the first SiP package.

11. The SD card of claim 8, wherein the first set of electrical contacts have rotational symmetry with the second set of electrical contacts.

12. The SD card of claim 8, wherein at least one of the SiP packages has SLC caching protocol.

13. The SD card of claim 8, wherein the first SiP package has dimensions of 32 mm×24 mm×2.1 mm.

14. The SD card of 13, wherein the electrical contacts include a first set of electrical contacts having a first pattern and the second set of electrical contacts have a second pattern that is narrower than the first pattern.

15. The SD card according to 14, wherein the second SiP package is electrically coupled to the second set of electrical contacts, and including a switch operative in a first position for selectively coupling the first set of electrical contacts to either the first SiP package for transferring data between the first SiP package and outside of the card through the first set of electrical contacts and a second position for selectively coupling the first set of electrical contacts with the second set of electrical contacts for transferring data between the second SiP package and outside of the card through the first set of electrical contacts, and including at least one of a battery and printed circuit board (PCB) within the enclosure.

16. The SD card according to claim 14, wherein the second SiP package is selectively removable from the enclosure.

17. A multi-memory Secure Digital (SD) card, comprising:
    a 32 mm×24 mm×2.1 mm SD card enclosure;
    a first SD SiP memory according occupying a first portion of the enclosure and communicating with a first set of external electrical contacts;
    a second SD SiP memory occupying a second portion of the enclosure and communicating with a second set of electrical contacts; and
    wherein the first set of external electrical contacts are located at a first end of the SD card enclosure and the second set of electrical contacts are located at an opposite end of the SD card enclosure.

* * * * *